(12) United States Patent
Hoernicke (10) Patent No.: US 10,346,584 B2
(45) Date of Patent: Jul. 9, 2019

(54) METHOD FOR GENERATING PLANT TOPOLOGY MODEL DATA

(71) Applicant: ABB AG, Mannheim (DE)

(72) Inventor: Mario Hoernicke, Landau (DE)

(73) Assignee: ABB AG, Mannheim (DE)

(*) Notice: Subject to any disclaimer, the term of this patent is extended or adjusted under 35 U.S.C. 154(b) by 651 days.

(21) Appl. No.: 14/899,177

(22) PCT Filed: May 13, 2014

(86) PCT No.: PCT/EP2014/059740
§ 371 (c)(1),
(2) Date: Dec. 17, 2015

(87) PCT Pub. No.: WO2015/007415
PCT Pub. Date: Jan. 22, 2015

(65) Prior Publication Data
US 2016/0140265 A1 May 19, 2016

(30) Foreign Application Priority Data
Jul. 15, 2013 (EP) .................................... 13003558

(51) Int. Cl.
*G06F 17/50* (2006.01)
*G05B 17/02* (2006.01)

(52) U.S. Cl.
CPC .......... *G06F 17/509* (2013.01); *G05B 17/02* (2013.01); *G06F 17/5004* (2013.01)

(58) Field of Classification Search
CPC .................................................. G06F 17/509
USPC ............................................................ 703/1
See application file for complete search history.

(56) References Cited

U.S. PATENT DOCUMENTS

| | | |
|---|---|---|
| 2007/0005266 A1 | 1/2007 | Blevins |
| 2010/0318847 A1 | 12/2010 | Beg et al. |
| 2011/0307224 A1 | 12/2011 | Schlereth |

*Primary Examiner* — Timothy A Mudrick
(74) *Attorney, Agent, or Firm* — Leydig, Voit & Mayer, Ltd.

(57) ABSTRACT

A method for generating model data of a plant having at least one sub-part involves: providing at least one respective diagram of an HMI interface for a respective sub-part, which contains topology information thereof; transferring the respective diagram, if necessary, into a computer readable form; importing the respective transferred diagram into a data storage of a computer and preferably automatically extracting model data of the respective sub-part therefrom, wherein the model data describe at least in part the topology of the respective sub-part; and providing the model data to an interface of the computer, wherein extracting model data from a diagram involves: detection of plant objects; and detection of plant object connections.

18 Claims, 5 Drawing Sheets

| PCS object type | Plant object type |
|---|---|
| Flow Transmitter | FlowSensor |
| Level Transmitter | LevelSensor |
| Temperature Transmitter | TemperatureSensor |
| Weight Transmitter | WeightSensor |
| Flow Signal | FlowSensor |
| Temperature Signal | TemperatureSensor |
| CBM_AIS | Sensor |
| CBM_DINTIS | Sensor |
| CBM_DIS | Sensor |
| CBM_DWIS | Sensor |
| SignalBasicInReal | Sensor |
| SignalBasicInBool | Switch |
| SignalInBoolM | Switch |
| SignalInRealM | Sensor |
| SignalSimpleInRealM | Sensor |
| SignalInBool | Switch |
| SignalInReal | Sensor |
| SignalReal | Sensor |
| SignalSimpleInReal | Sensor |
| OT_AnaloguePresenterType | Sensor |
| MAV_AnalogueInType | Sensor |
| MA_AnalogueInType | Sensor |

| Unit | Plant object type |
|---|---|
| l/m | FlowSensor |
| °C | TemperatureSensor |
| kg | WeightSensor |

| Actuator display name | Plant object type |
|---|---|
| Feeder | Actuator |
| Pump | Pump |
| ValveMotor | Valve |

| Tag prefix (sensor prefix) | Plant object type |
|---|---|
| L | LevelSensor |
| P | PressureSensor |
| F | FlowSensor |
| T | TemperatureSensor |

| Unit | Plant object type |
|---|---|
| % | Valve |
| rpm | Actuator |

| PCS object Type | Plant object type |
|---|---|
| Block Valve | Valve |
| Bypass Valve | Valve |
| Control Valve | Valve |
| Manual Valve | Valve |
| MotorValveCC | Valve |
| MotorValveH | Valve |
| MotorValve | Valve |
| ValveUniM | Valve |
| ValveUni | Valve |
| OT_ValveType | Valve |
| OT_ValveBasicType | Valve |
| Circulation Pump | Pump |
| Agitation | Agitator |
| Motor | Actuator |
| MotorBiM | Actuator |
| MotorUniM | Actuator |
| MotorBi | Actuator |
| MotorUni | Actuator |
| ACStdDriveM | Actuator |
| DCStdDriveM | Actuator |
| EngStdDriveM | Actuator |
| ACStdDrive | Actuator |
| DCStdDrive | Actuator |
| EngStdDrive | Actuator |
| OT_MotorType | Actuator |
| SignalOutRealM | Actuator |
| SignalOutReal | Actuator |

160

US 10,346,584 B2

METHOD FOR GENERATING PLANT TOPOLOGY MODEL DATA

CROSS-REFERENCE TO RELATED APPLICATIONS

This application is a U.S. national stage application under 35 U.S.C. § 371 of International Application No. PCT/EP2014/059740, filed on May 13, 2014, and claims benefit to European Patent Application No. 13 003 558.7, filed on Jul. 15, 2013. The International Application was published in English on Jan. 22, 2015, as WO 2015/007415 A1 under PCT Article 21(2).

FIELD

The invention is related to a method for generating model data of a plant having at least one sub-part.

BACKGROUND

It is known that plants in for example process industry typically comprise a larger number of meshed sub-parts. A sub-part of a plant is normally related to a sub-task of the whole production process, such as mixing a substance for further production. Since such sub-tasks often are rather independent from other sub-tasks up to a certain degree, the respective sub-parts of plants are often planned independently each from each other and even might be realized by different sub-suppliers. Also respective control systems are typically planned independently from each other, are related to a respective sub-part of a plant and are meshed together to a complex control network for the whole plant in the final engineering phase.

Thus, complex network solutions and distributed control systems are nowadays highly required in process industries, including a lot of different fieldbus systems, controllers, server and workstation PCs, process control software, devices and many more parts that are very complex to engineer, manage and maintain. In addition, the complexity of process plants increases. This makes the solutions very hard to handle and, of course, costs a lot of time during engineering. The rising complexity of process plants and the simultaneously decreasing time for automation engineering evolves the requirement for a higher degree of automation in engineering.

Known approaches for engineering of complex network solutions for plants have in common that they are based upon a computer interpretable (semi-) formalized information representation from the process engineering and front-end engineering and design phases. Although there are standardized—and more or less formal—formats available and there are well structured methods for data exchange published, the process specification is not provided in a standardized computer readable format. Such standardized formats are for example CAEX—IEC62424,
AutomationML—IEC62714 or
XMpLant—ISO15926.

The interface between automation engineering and process engineering across different departments or even company borders is usually not implemented in a structured manner, but the specifications are either printed on paper or in a standard computer storage format such as "PDF" or "JPG" and exchanged in that manner. Thus model data of a plant describing its overall functionality or even the topology of a single sub-part of a plant are typically available—if at all—in the final end of the engineering phase.

Disadvantageously within this state of the art is that—without having model data of a plant available already in an early stage of the engineering process—an overall consideration of a complex production plant over all its sub-parts is not possible. Thus potential faults in the design of a sub-part of a plant will be detected—if at all—in a rather late stage of an engineering project.

SUMMARY

An aspect of the invention provides a method for generating model data of a plant including a first and a second sub-part, the method comprising: providing at least one respective diagram of an HMI interface for a respective sub-part, the HMI interface including topology information of the respective sub-part; transferring respective diagrams, if necessary, into a computer readable form; importing respective transferred diagrams into a data storage of a computer and automatically extracting model data of the one or more respective sub-parts from the data storage, the model data describing, at least in part, topology and boundary connections of the respective sub-parts; and providing the model data to an interface of the computer, wherein the automatically extracting model data from a diagrams includes: detecting plant objects; detecting plant object connections; identifying associated boundary connections by identifying respective associated sinks and sources of at least two different sub-parts; and merging respective sub-part model data together to plant topology model data, wherein respective associated boundary connections are linked by a flow.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Based on this state of the art, an aspect of the invention provides a method for generating model data of a plant preferably already in an early engineering phase, so that an overall consideration also of meshed sub-parts of a complex plant is enabled also in an early stage of the engineering process. But also during production process of a running plant the method according to the invention will be of advantage.

One or more problems of the art can be solved by a method comprising:

providing at least one respective diagram of an HMI interface for a respective sub-part, which contains topology information thereof, transferring the respective diagram—if necessary—into a computer readable form, importing the respective transferred diagram into a data storage of a computer and preferably automatically extracting model data of the respective sub-part therefrom, wherein the model data describe at least in part the topology of the respective sub-part, providing the model data to an interface of the computer, wherein extracting model data from a diagram comprises the following steps:

detection of plant objects, detection of plant object connections.

The basic idea of this invention consists in reusing graphics and object information present in the human machine interfaces (HMI) for the generation of a plant topology model. Although not all and every information is present in the HMI, at least large parts can be generated from it.

An HMI interface of a sub-part of a plant is typically available in an early stage of the engineering phase of a plant since the sub-parts are typically engineered individually from each other. An HMI interface is a graphic which is presented to a user for further interaction during operation of a plant. To give an overview on a respective sub-part of a plant to a user, information of the topology of the sub-part is contained within an HMI interface. During operation of a plant an HMI interface typically also contains actual values concerning the actual operational parameters of the respective sub-part of a plant such as temperature, mass flow, energy consumption or such. But also constructional drawings might contain suitable information about the topology of a sub-part of a plant.

An HMI diagram might be available in a meta-language, comprising for example PCS (Process Control System) objects, so that additional information is derivable therefrom. A transfer of an HMI diagram into a computer readable form means preferably a transfer to a computer readable graphical form, so that methods of pattern or character recognition might become applied thereon. A "PDF" or "JPEG" file but also the description of an HMI diagram in a meta-language is typically already a suitable computer readable form, whereas for example a plot on a paper has to be transferred to a computer readable form by scanning them. During production process of a plant also a screenshot of an HMI interface contains suitable information for generating model data of a plant.

Extracting model data comprises two major steps, the detection of plant objects (nodes) and the detection of connections (branches).

In a first step, active objects (from the point of view of an automation system, meaning sensors and actuators) need to be identified. There are a few common methods how those are drawn in an HMI diagram. The most common method is to use direct references to a PCS object. PCS objects provide the display elements and the display elements can be reused in the graphic. Therefore, the active objects can be identified by checking if the display element is a reference to a PCS object.

Another common method to display values of sensors is to use value displays. The value displays have typically two fields that can be connected to variables of the corresponding PCS object, the value itself and the unit. When the variables are connected, there is also a reference to the PCS object included, which can be evaluated, as well, by following the link to the variable.

A similar method can be used for actuators, where often an actuator symbol is used, which changes its color when the state of the actuator changes, e.g. motor is switched on then the symbol is changing its color from gray to green. Here also the reference to the variables can be used to detect the corresponding PCS object and PCS object type.

In addition to the sensors and actuators, the controllers used in the display can be detected. A controller usually provides a special symbol with its object, as well and hereby, the controller object inside the PCS can be identified.

In addition to the detection of the objects, the type of some objects can be identified, as well. Only from the PCS object, it is usually not feasible to identify the plant object type. There is the possibility to have special object types for valves or pumps, for example, but usually, the plant objects are controlled using standard motor objects or are just represented by an I/O signal object in the PCS. Hence, the "general" type—if it is a sensor or an actuator—can be identified by using the PCS object type and map it to the plant object type, but the "specific" type—pressure transmitter or pump—can only be identified by evaluating further information.

A possible source that is used in the method according to the invention is the display type of the object. Assumed is that the operator screens are developed to show the operator a close view on the process and therefore, that pump symbols are used for pumps and fan symbols are used for fans. Hence, the display symbol in combination with the object type can be mapped to the plant object type and therefore being used for the identification of the specific type.

For the sensors a different method might be used, since most sensors use the same display type to visualize the values. There are also symbols used for specific sensor types—for example a level display is used for a level sensor—but in general, the value displays look the same. Therefore, it is proposed to use the unit of the value display to identify the sensor type. The unit is usually unique to a sensor type—e.g. "Bar" is used for pressure and "° C." is used for temperature for example. Based on this, the specific sensor type can be identified. Those units can also easily being mapped to the specific type. The same principal is also suitable for actuators if those are engineered using simple value displays, as well. Another possibility to identify the specific type of a plant object is to use prefixes that are sometimes shown in the displays, as well or within the tag name of the PCS object.

Although the HMI might not necessarily describe the attributes of sensors, actuators, or controllers entirely, some very important attributes can be gathered from it. The most important attributes concerning the active plant objects are related to actuators. The actuation direction of actuators, especially pumps, fans, feeders and similar objects is of importance. The direction can be gotten from the symbol direction of the actuator by including the rotation of the symbol. Hence, the symbol direction plus the rotation is the actuation direction. The direction can be stored for the objects and later used to connect the material flow (pipes) to the inlet and outlets of the actuators.

Another important object attribute that is implicitly included in the HMI is the type of actuator. By identifying the variable connection to the PCS object and the type of the connected signal/variable it can be evaluated whether it is a continuous, discrete, or Boolean actuator. This information can also be stored in the object representation in the plant topology.

Besides the flow graphs and the basic object types of the plant object, general attributes can be gathered, as well. An important aspect that can be included in the topology model is the type of media flowing through the pipes in the material flow. This information is often contained in the HMIs, as well.

According to a further variant of the method according to the invention the additional step of generating further model data describing a material flow through plant object connections is foreseen.

After active plant objects have been identified, material storage objects need to be identified. A material storage is usually a tank in process industry. Within the HMI a tank can be designed in different ways: There are closed tanks, open tanks, cone tanks, etc. What all tanks have in common is that they have a tank body. The tank body is usually designed as a separate graphic and afterwards the bottom and top are individually designed to fit the process plants tank. Hence, tanks are identified by using the body and when overlapping tops or bottoms are found those are included in the tank object. Hence, the type of graphic symbol is used to identify the material storage.

Based on the individual representation of the tank, an additional attribute can be extracted. It can be identified if it is an open or closed tank, which is important for some algorithms to know. E.g., if the tank has a tank top symbol above the tank body, the tank is assumed to be a closed tank. If the tank top is missing, the tank is assumed to be an open tank. Again, this assumption bases on the fact that the HMI is designed to present a close to reality view on the plant. Therefore, this assumption can be made.

In the next step, the material flow is identified based on the graphical symbols for lines and pipes. Both, lines and pipes, are represented by several points, with respective segments inbetween. Each point describes a corner of the pipe. So as a first step, the symbols are gathered and the coordinates of the points are used to separate the pipe into segments. Each segment is a piece of a pipe that has exactly two graphical points/two coordinate pairs for the beginning and the end of the segment. For each segment of each pipe, it is evaluated whether there is actuator- or material storage symbols touching it or hiding a part of the segment. If an actuator- or material storage symbol is touching a pipe segment, the coordinates of this pipe segment are recalculated to fit with the symbols coordinates of the symbols outline. If the symbol is hiding a part of the pipe segment, the pipe segment is split into two pipe segments with beginning/ending coordinate at the symbols outline.

The information about which symbol touches or hides pipe segments is stored. This information is afterwards used to store that the plant object (that is represented by the symbol) is connected to the hidden/touched pipe segment. When this evaluation has finished, each new pipe segment—new, in case a segment from the beginning has been split into two or more segments—has at least one plant object or material storage object connected to it. If two are connected, this pipe segment does not have to be further evaluated. If one is connected, it is evaluated whether the segment is connected to another segment. If this is the case, the two segments are combined into a single segment.

A common method to engineer the visualization of different media types used in the process is to use a color coding for the pipes and lines. E.g., a pipe containing air could be visualized using a light blue line. A pipe containing oil could be visualized using a brown line. Hence, the user could configure the line colors for the different media and hereby, the method according to the invention could extract the information about which media is flowing through a pipe, for example blue line for water, and orange lines for gas. Therefore, the media type of the blue pipe can be set to water and the media type of the orange line can be set to gas for example.

The detection of a flow inbetween a respective sink and source is valuable information which can also be used for example to find associated boundary connections inbetween different sub-parts of a plant topology.

By using such a method, a graph for the material flow is created. The graph consists (in the end) of nodes (actuators, material storage, . . . ) and edges (pipe segments). It is not necessarily a directed graph, because only for special actuators, an actuation direction has been evaluated at the beginning. If this is the case, for example for pumps, this part of the graph comprises already a respective direction in its edges.

As last part of the creation of the material flow, the actuators directly connected to material storage need to be attached to it. In order to create those connections, a certain area surrounding the material storage is searched for overlapping actuator symbols According to a further embodiment of the method of the invention the additional step of generating further plant topology model data describing an information flow through plant object connections is included. Another graph that represents an important part of the plant topology is the information flow. The information flow shows for example the connections of sensors to the material flow and the connections between control objects, sensors, and actuators (control loops). In the HMI, usually only the important control loops are displayed. Nevertheless, the information flow for those can be extracted and reused in the plant topology.

There are different notations used for the signal connections. The signal connections are implicitly shown within an HMI by drawing a value display of a sensor very close to a pipe or a material storage, or special brushed lines are used. In such a case, a similar approach like for the connection of actuators to a material storage can be used. A surrounding area around a pipe is searched for sensor symbols. If a sensor symbol is found, it can be assumed that the sensor is measuring a process value at this pipe. A signal connection between the sensor and the pipe can be created. It cannot be quantitatively evaluated, where the value is measure, but at least qualitatively, one can create a connection to a specific area of the pipe.

Since this variant of the method is sometimes not very accurate and there are also other notation used, the signal connections to pipes should be generated from the other notation if possible. A common method to visualize the connection of a sensor to a pipe (to visualize a point of measurement) is to use special drawn lines. Those lines are usually dotted or dashed or drawn in a specific color.

By simply configuring the visualization of the signal connection pipes by user, it can be distinguished by the algorithm between pipe lines and signal lines. By use of the described proceeding, the information flow visualized in the HMI can be created. This cannot be treated to be complete, since there are lot more connections in the control code that are not visualized. Nevertheless, those graphs can be treated as being the most important connections and should therefore being included in this part of the topology model.

In the same manner like for the material flow, the connections between the active objects (sensors, actuators, and controllers) can be determined. Hereby, not only the measurement points at a tank or pipe can be evaluated, but also the connections of complete control loops are implicitly evaluated. Those connections can be stored in the model data, as well. In contrast to the material flow graphs, information flow graphs are directed, since the information flow is always from one or more sensors through one or more control units to one or more actuators.

Additionally, when the signals are detected and the information flow is created, direct references to the PCS signals can be created. The information flow contains the important connections of signals to pipes, hence, it is known, which signals are used to measure a process value at a specific pipe. This can be later used to create a connection between the process objects and the PCS objects According to a further embodiment of the method of the invention the additional step of generating further plant topology model data describing an energy flow through plant object connections is included. The principal proceeding is comparable to the detection of material flow respectively information flow.

According to a further embodiment of the method of the invention a respective diagram of an HMI interface is provided for at least two different sub-parts of the plant and the model data describe at least in part also boundary connections of a respective sub-part, wherein the following additional steps are foreseen:
  identifying associated boundary connections by identifying respective associated sinks and sources of at least two different sub-parts,
  merging the respective sub-part model data together to plant topology model data, wherein respective associated boundary connections are linked by a flow.

When the graphs of the information flow and/or the material flow within a sub-part of the plant are created, an important thing, the model boundaries are missing. The material flow starts from somewhere from an open pipe and end somewhere with an open pipe. In most cases, the boundaries of the model are of importance. Thus it is possible, to combine respective sub-part model data together to plant topology data describing the whole plant topology. Those boundaries show the connections to other model parts (perhaps generated from other HMIs) and are therefore very important.

An information flow usually has a beginning and an ending, like in control loops, the beginning is the sensor and the ending is the actuator, whereas a material flow might not have those boundaries. Hence, material sources and material sinks need to be created to close the models boundaries.

In order to create material sources and sinks, the material flow needs to be evaluated again. The pipes that have open connection (every edge in the material flow graph that is only connected to a single node) need to be further evaluated. When the pipes that are only connected to a single actuator or material storage are found, the arrows that are usually used to visualize direction of material flow can be used to evaluate whether a source or a sink needs to be created at the open end of the pipe.

Additionally, if actuators with actuation direction are used, the direction of the material flow inside the pipe is also clear and therefore, via the connections to the actuator, it can be evaluated whether the open endings should be connected to a sink or a source. When the sinks and sources are successfully identified, the material flow graph is directed, as well and all edges are connected to nodes.

According to a preferred embodiment of the invention extracting model data from a diagram is done at least in part by use of a method of pattern recognition. The computer readable form of the HMI diagram is preferably in a graphical form, thus the typical graphical for objects and connections can be detected by the method of pattern recognition, for example by use of artificial neural networks. Typically the method of pattern recognition is foreseen to detect plant objects and/or connections such as valves, flow pipe segments, tanks, pumps, drives, sensors or such.

According to a further embodiment of the invention extracting model data from a diagram is done at least in part by use of a method of character recognition. Typically the method of character recognition is foreseen to detect value numbers and respective physical units such as "° C.", "l/min" or "kg" from a value display within the HMI diagram. As mentioned before, the physical units enable the assignment to plant objects for example if they are located within the diagram in the proximity of a respective plant object. In principal, also the method of character recognition is based on pattern recognition.

According to a further embodiment of the invention detected plant objects and/or recognized characters, which are graphically touching each other within a respective HMI diagram, are automatically checked, if it useful to combine them with respect to a feasible plant topology. If for example an electrical motor is detected as graphical symbol within an HMI diagram then a value field containing the physical unit "kg/min" is not appropriate to combine with data of the motor. Moreover, if a value field with the physical unit "kg/min" is located in close proximity to a pipe for example, it is appropriate to assume a connection of the pipe and a respective mass flow. Also in case that one pipe segment is touching another pipe segment within a corner, then it is appropriate to assume that both pipe segments should be combined.

According to a further embodiment of the invention, detected plant objects, connections and/or characters are combined respectively linked within the plant model data in case that result of the check is positive. Thus an automatic connecting of associated objects, object-parts or connections is enabled, wherein due to the feasibility check a wrong association is predominately avoided.

In some cases it is not possible to detect automatically all plant objects respectively connections or associations of plant objects with connections and/or characters from a value field. In such cases it is foreseen according to a further variant of the invention, that extracting model data from a diagram is done at least in part by use of an application programming interface. In such a case, the user can manually associate certain characteristics to a plant object or a connection.

Further advantageous embodiments of the invention are mentioned in the dependent claims.

Figure 1:
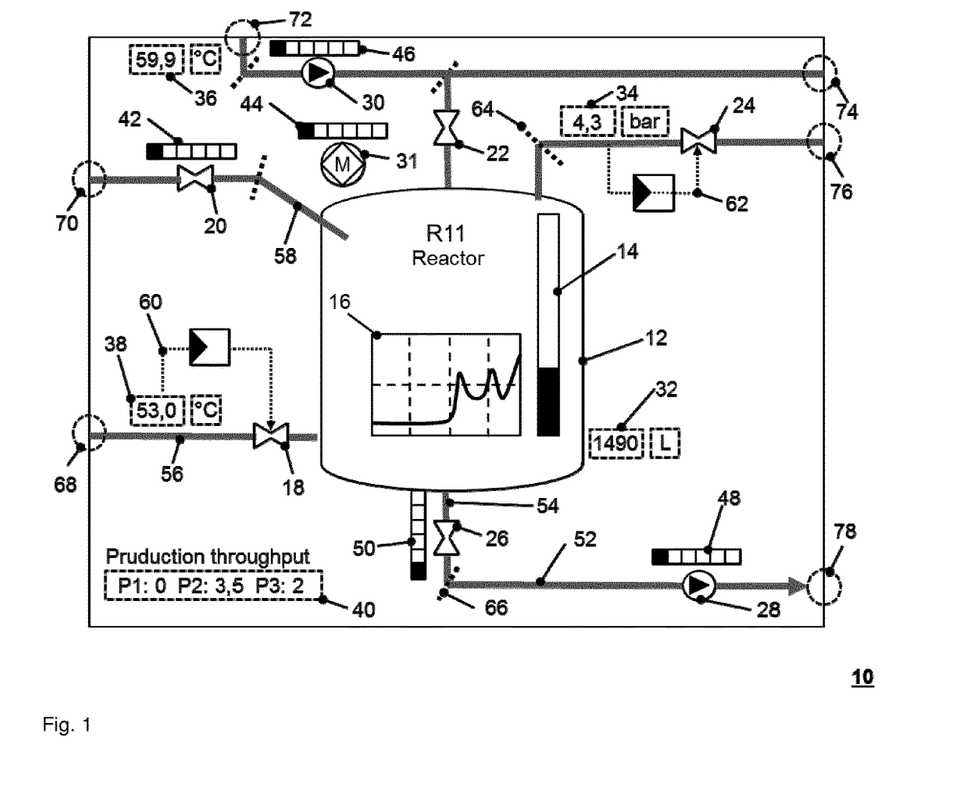
FIG. 1 shows an exemplary diagram of HMI interface representing a sub-part of a plant.

FIG. 1 shows an exemplary diagram 10 of HMI interface representing a sub-part of a plant in process industry. Such an HMI diagram 10 might be presented to a user on a screen of a process visualization system for example. In the center of the diagram 10 a tank 12 of a reactor is shown. Associated to the tank 12 and within its boundaries level displays 14 and 16 are shown, which are representing an actual status within the tank. A larger number of pipes respectively pipe segments 52, 54, 56, 58 is representing material connections from and to the tank 12. Corner points 64, 66 are foreseen inbetween associated and connected pipe segments.

For influencing the material flow through the connections, several valves 18, 20, 22, 24, 26 are foreseen, which can become opened, closed or brought in any partly opened state. For representing the actual status of the valves 20, 26, respective associated level displays 42, 50 are foreseen in such proximity of a respective valve, that a respective geometrical association of valve and level display is possible. Further level displays 46, 48 are foreseen to represent the respective actual status of pumps 28, 30, which are foreseen within respective pipelines.

Value displays 32, 34, 36, 38 having a first area for values and a second area for units are foreseen to represent actual process parameter. The first value display 32 is associated to the tank 12 and is representing its filling level. The fourth value display 38 is associated to a pipe and is representing the pressure within this pipe. Furthermore the pressure is used as control value within a control loop 62, which is controlling the valve 24. Comparable thereto the value display 38 is associated to the pipe segment 56 and the respective temperature value is a control value for a control loop 60, which is controlling the valve 18. The connections within the control loops 60, 62 are connections for information. A motor 32, for example for a radiator, is shown as a symbol with associated level display 44. Value display 40 is representing overall data of the sub-part of the process plant.

Some of the pipes respectively pipe segments 52, 54, 56, 58 are ending at the edge of the HMI diagram 10 at respective boundary connections 68, 70, 72, 74, 76, 78. Each of the boundary connection is associated to a sink respectively a source. Thus a connection of the sub-part of the process plant represented by the HMI diagram 10 can be realized by a (material-) flow inbetween associated sinks and sources of different sub-parts of the process plant.

Figure 2:
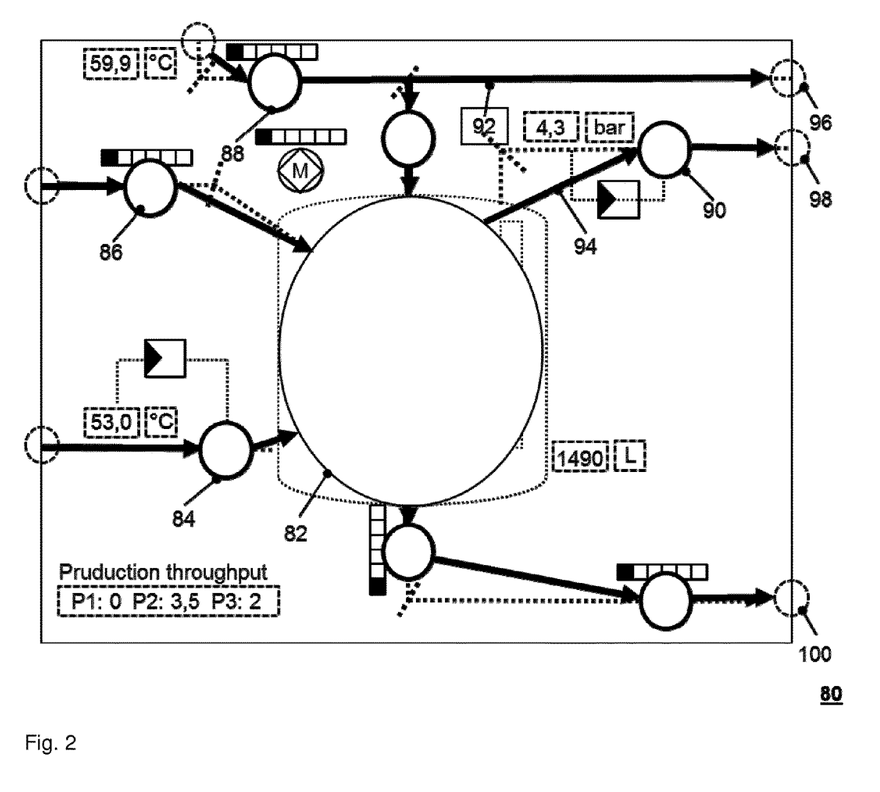
FIG. 2 shows an exemplary material flow graph.

FIG. 2 shows an exemplary material flow graph, which is laid over the HMI diagram showed in FIG. 1. Active plant objects which are related to material flow are shown as nodes 82, 84, 86, 88, 90. The boundary connections at the edge of the HMI diagram are shown with reference numbers 96, 98, 100. Connections for material flow inbetween the active nodes 82, 84, 86, 88, 90 respectively boundary connections are shown as respective lines with reference numbers 92, 94.

Figure 3:
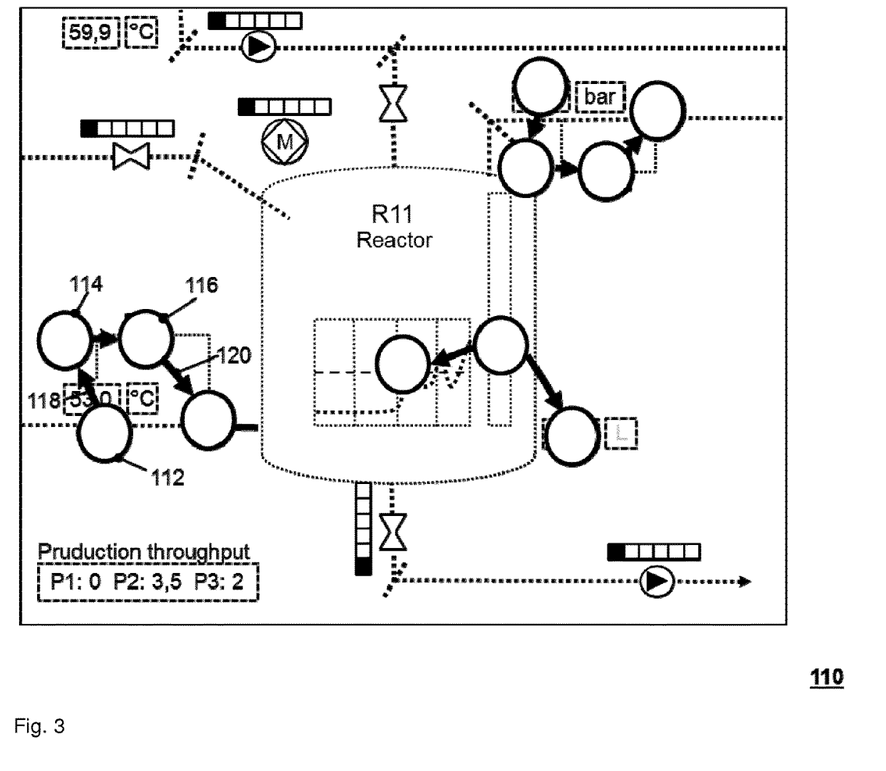
FIG. 3 shows an exemplary information flow graph.

FIG. 3 shows an exemplary information flow graph, which is laid over the HMI diagram showed in FIG. 1. There are two control loops, which are represented by respective nodes 112, 114, 116 for information flow, and connections 118, 120. The nodes 112, 114, 116 comprise a respective sensor, a control unit and a controlled actuated valve.

Figure 4:
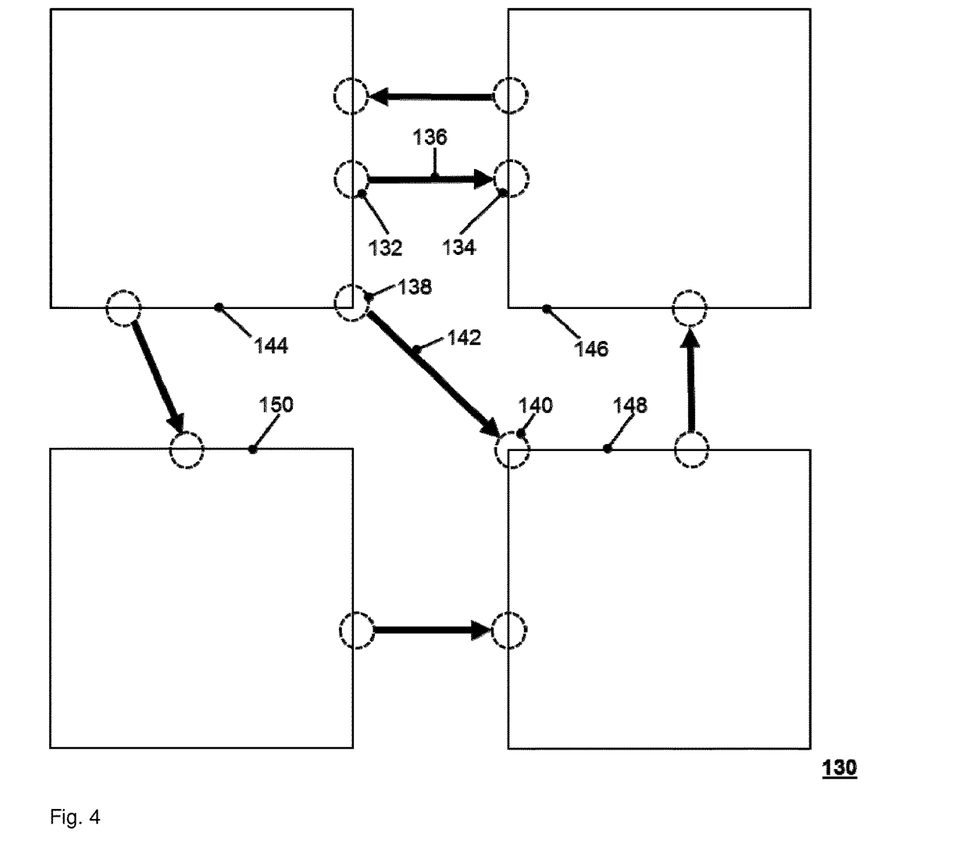
FIG. 4 shows an exemplary topology of linked sub-parts of a plant.

FIG. 4 shows an exemplary topology of linked sub-parts 144, 146, 148, 150 of a plant in a sketch 130. The sub-parts 144, 146, 148, 150 comprise respective boundaries 132, 134, 138, 140 which can be seen as sinks respectively sources of material and which are linked by a respective material flow 136, 142. Of course, also a respective information flow or a respective energy flow are suitable to link sub-parts of plants in case that respective sinks and sources of information or energy are provided at the boundary connections of the sub-parts.

Figure 5:
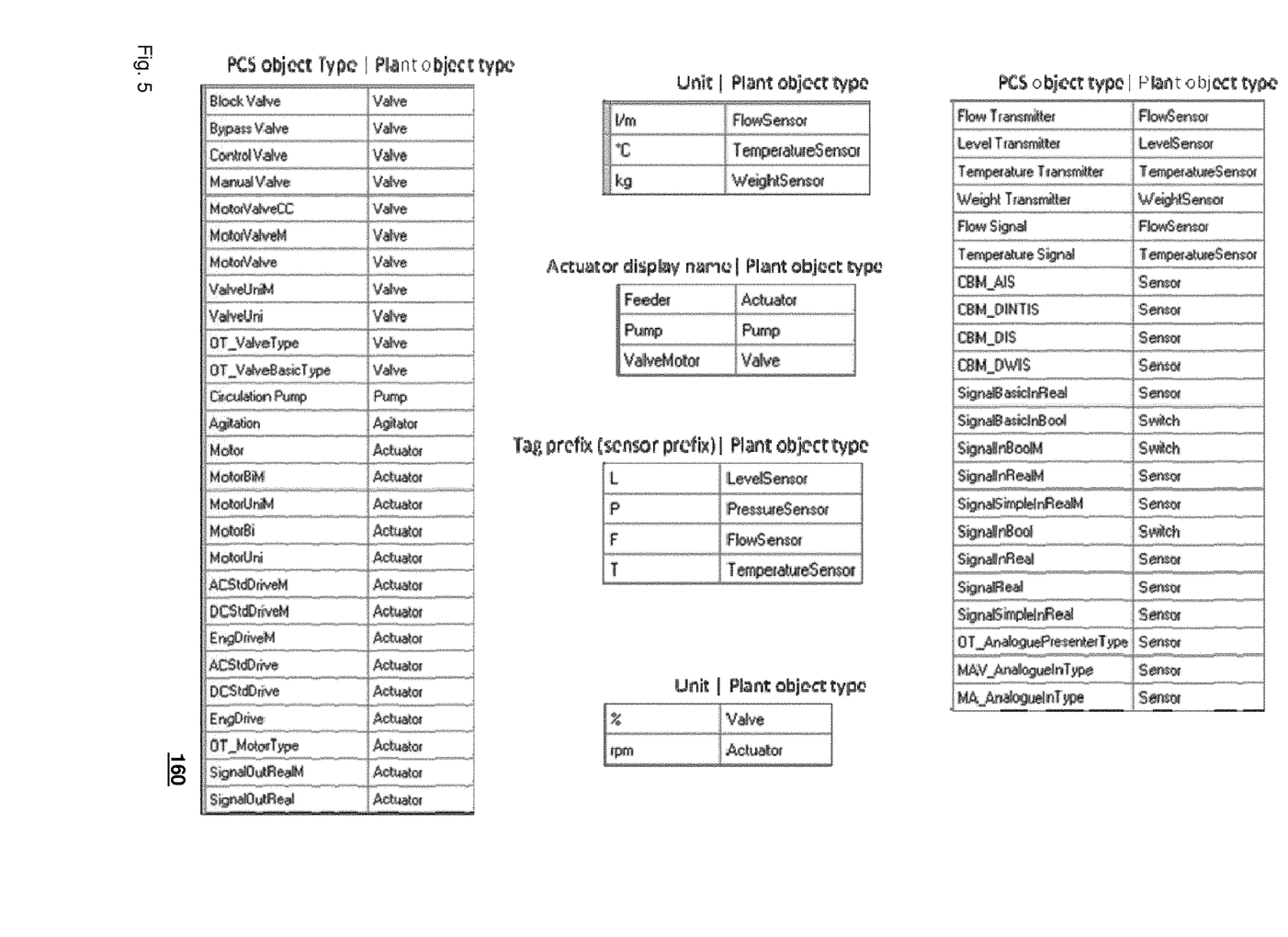
FIG. 5 shows an exemplary identification of general plant object types.

FIG. 5 shows an exemplary identification of general plant object types in a table 160. Assuming, that an HMI diagram is available in a meta-language, where it is programmed in, additional information about the HMI diagram can be derived therefrom. PCS objects, describing a plant object on the screen, are an important source of information. Here several examples for a relation inbetween PCS object types and plant object types respectively. PCS object types are the type of object as they are used within the HMI diagram and plant object types are the—more general—type of object as they are considered within the flow diagram (material, information, energy) as extracted and built according to the method of the invention.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

LIST OF REFERENCE SIGNS 10 exemplary diagram of HMI interface representing a sub-part of a plant
12 tank (sink)
14 first level display
16 second level display
18 first valve
20 second valve
22 third valve
24 fourth valve
26 fifth valve
28 first pump
30 second pump
31 motor
32 first value display with reference unit
34 second value display with reference unit
36 third value display with reference unit
38 fourth value display with reference unit
40 fifth value display with reference unit
42 third level display
44 fourth level display
46 fifth level display
48 sixth level display
50 seventh level display
52 first pipe segment
54 second pipe segment
56 third pipe segment
58 forth pipe segment
60 first control loop
62 second control loop
64 first product connection
66 second product connection 68 first boundary connection
70 second boundary connection
72 third boundary connection
74 fourth boundary connection
76 fifth boundary connection
78 sixth boundary connection
80 exemplary material flow graph
82 first node of material flow graph
84 second node of material flow graph
86 third node of material flow graph
88 fourth node of material flow graph
90 fifth node of material flow graph
92 first node connection of material flow graph
94 second node connection of material flow graph
96 first boundary connection of flow graph
98 second boundary connection of flow graph
100 third boundary connection of flow graph
110 exemplary information flow graph
112 first node of information flow graph
114 second node of information flow graph
116 third node of information flow graph
118 first node connection of information flow graph
120 second node connection of information flow graph
130 exemplary topology of linked sub-part of a plant
132 first boundary connection of first sub-part of plant
134 first boundary connection of second sub-part of plant
136 first material flow connecting respective sub-parts
138 second boundary connection of first sub-part of plant
140 first boundary connection of third sub-part of plant
142 second material flow connecting respective sub-parts
144 first sub-part of plant
146 second sub-part of plant
148 third sub-part of plant
150 fourth sub-part of plant
160 exemplary identification of general plant object types

The invention claimed is:

1. A method for generating model data of a plant including a first and a second sub-part, the method comprising:
providing at least one respective diagram of an HMI interface for a respective sub-part, the HMI interface including topology information of the respective sub-part comprising graphics and object information;
transferring respective diagrams, if necessary, into a computer readable form;
importing respective transferred diagrams into a data storage of a computer and automatically extracting model data of the one or more respective sub-parts from the data storage, the model data describing, at least in part, topology and boundary connections of the respective sub-parts; and
providing the model data to an interface of the computer, wherein the automatically extracting model data from diagrams includes:
detecting plant objects;
detecting plant object connections;
identifying associated boundary connections by identifying respective associated sinks and sources of at least two different sub-parts; and
merging respective sub-part model data together to form plant topology model data, wherein respective associated boundary connections are linked by a flow, the respective sub-part model data originating from the graphics and object information of the at least one respective diagram of the HMI interface.

2. The method of claim 1, further comprising:
generating further model data describing a material flow through plant object connections.

3. The method of claim 1, further comprising:
generating further plant topology model data describing an information flow through plant object connections.

4. The method of claim 1, further comprising:
generating further plant topology model data describing an energy flow through plant object connections.

5. The method of claim 1, wherein the automatically extracting model data from a diagram is done at least in part using a method including pattern recognition.

6. The method of claim 5, wherein the method of pattern recognition includes detecting plant objects.

7. The method of claim 1, wherein the automatically extracting model data from a diagram is done at least in part using a method including character recognition.

8. The method of claim 7, wherein the method of character recognition includes detecting value numbers and respective physical units, including "° C.", "l/min" and/or "kg," from a value display within the diagram.

9. The method of claim 7, wherein detected plant objects and/or recognized characters, which are graphically touching each other within a respective HMI diagram, are automatically checked to determine whether to combine them with respect to a feasible plant topology.

10. The method of claim 9, wherein detected plant objects, connections, and/or characters are combined respectively within the plant model data if a result of the check is positive.

11. The method of claim 1, wherein the automatically extracting model data from a diagram is done at least in part using an application programming interface (API).

12. The method of claim 2, further comprising:
generating further plant topology model data describing an information flow through plant object connections.

13. The method of claim 2, further comprising:
generating further plant topology model data describing an energy flow through plant object connections.

14. The method of claim 3, further comprising:
generating further plant topology model data describing an energy flow through plant object connections.

15. The method of claim 12, further comprising:
generating further plant topology model data describing an energy flow through plant object connections.

16. The method of claim 5, wherein the method of pattern recognition includes detecting plant connections.

17. The method of claim 6, wherein the method of pattern recognition includes detecting plant connections.

18. The method of claim 5, wherein the method of pattern recognition includes detecting a valve, flow pipe segment, tank, pump, drive, sensor, or a combination of two or more of any of these.

* * * * *